United States Patent [19]
Clemens

[11] Patent Number: 5,590,025
[45] Date of Patent: Dec. 31, 1996

[54] FAN ATTACHMENT CLIP FOR HEAT SINK

[75] Inventor: Donald Clemens, The Colony, Tex.

[73] Assignee: Thermalloy, Inc., Dallas, Tex.

[21] Appl. No.: 482,011

[22] Filed: Jun. 7, 1995

[51] Int. Cl.⁶ .................................... H05K 7/20
[52] U.S. Cl. ...................... 361/695; 24/458; 165/80.3; 165/185; 257/718; 361/710
[58] Field of Search ............................. 24/457, 458, 555, 24/625; 165/80.2, 80.3, 121–122, 185; 174/16.3; 257/706, 707, 713, 718, 719, 726, 727; 361/695–697, 704, 707, 709–711, 715–718, 722; 415/175–178

[56] References Cited

U.S. PATENT DOCUMENTS

| 4,884,331 | 12/1989 | Hinshaw | 29/558 |
| 5,287,249 | 2/1994 | Chen | 361/718 |
| 5,386,338 | 1/1995 | Jordan et al. | 361/704 |
| 5,421,402 | 6/1995 | Lin | 165/80.3 |

OTHER PUBLICATIONS

Thermalloy Semiconductor Accessories Catalog, 1990, pp. 15–29.

Primary Examiner—Gregory D. Thompson
Attorney, Agent, or Firm—Woodcock Washburn Kurtz Mackiewicz & Norris

[57] ABSTRACT

A clip secures a pin fin heat sink to a fan. The clip includes a frame having a width which can be wedged between the fins of the heat sink. Blades extend downwardly from the frame and bear against the heat sink fins to secure the frame to the heat sink. The clip is locked in place by barbs which extend upwardly to engage the fins of the heat sink when the clip is urged in a direction which would free it of the heat sink.

15 Claims, 3 Drawing Sheets

FAN ATTACHMENT CLIP FOR HEAT SINK

BACKGROUND OF THE INVENTION

This invention relates to a clip for attaching a fan to a heat dissipating heat sink.

Many semiconductor devices generate heat during operation which must be dissipated to avoid damage to the device. Some such devices have power-handling limitations which are largely determined by their ability to expel internally-generated heat and thereby avoid general or localized thermal degradations or failures within them.

In some semiconductor devices, the internally-generated heat is dissipated sufficiently by the enclosure, header or leads of the device. In many semiconductor devices, however, it is necessary to aid the dissipation of internally-generated heat by the use of heat sinks. A wide variety of heat sink designs have been employed for dissipation of internally-generated heat from electronic device packages which house semiconductor devices. For the purposes of the present invention, a heat sink is a body of metal or like material which is placed in contact with an electronic device package for transferring internally-generated heat from the semiconductor device contained in the electronic device package and for rapid dissipation of the internally generated heat to the atmosphere by conduction, convection and/or radiation.

U.S. Pat. No. 4,884,331-Hinshaw shows a widely used heat sink commonly referred to as a pin fin heat sink. The heat sink has rows and columns of upstanding parallel fins. The heat sinks are formed by first extruding rows of upstanding fins and then cross-cutting the fins to form rows and columns of pin fins.

These devices are frequently adequate to cool electronic devices by themselves. However, in many applications, it is desirable to add a fan which blows cooling air over the fins of the heat sink. The prior art technique of securing a fan to heat sink is by inserting a screw, or like fastener, through the mounting holes of the fan into the space between upstanding pin fins. This is not satisfactory, because often a space between pin fins does not line up with all of the mounting holes on the fan. The clip of the present invention obviates this problem.

It is an object of the present invention to provide a clip which makes the assembly of the fan to a heat sink much easier.

SUMMARY OF THE INVENTION

In accordance with the present invention, a clip includes a frame having a width which can be wedged between the fins of the heat sink. The clip has means to secure the fan to the frame. The frame is wedged between the fins of the heat sink and then locked in place. The rectangular shape of the frame fits between rows and columns of fins on the heat sink.

Blades frame is formed from a sheet of resilient metal. The blades extend downwardly from the frame. The blades are inserted between the columns of pin fins in the space formed by cross-cutting.

The clip of the present invention has important advantages when assembled with the blade between columns of pin fins formed by cross-cutting. The cross-cut gap between columns of pin fins is narrow and of a constant dimension. Because of this, the clip of the present invention will always provide good engagement and locking in the heat sink. On the other hand, the gap between the extruded rows of pin fins varies depending upon the size of the heat sink. One size clip will not wedge in the extruded rows of all heat sinks.

The insertion of the clip of the present invention into cross-cut gaps between columns of pin fins has another important advantage. The fins often have better strength in the extruded direction and this is the direction against which the locking force of the clip is applied.

The clip of the present invention is adaptable to different sizes of heat sinks and it is adaptable to different types of fans. The clip of the present invention can be inserted into heat sinks having relatively long or relatively short pin fins. In the longer pin fin heat sinks, the clip does not bottom out at the base, but the clip is securely locked in place.

The clip can be used to mount fans of various types. These include fans which have slots or holes at the corners thereof.

Further in accordance with the invention, the blades of the frame have arcuate cut-outs. The arcuate cut-out traps a Z clip in the heat sink. This aids in the assembly of a heat sink with a socket wherein the Z clip secures the heat sink to an electronic device.

The foregoing and other objects, features and advantages of the invention will be better understood from the following more detailed description and appended claims.

SHORT DESCRIPTION OF THE DRAWINGS

DESCRIPTION OF THE PREFERRED EMBODIMENT

Figure 1:
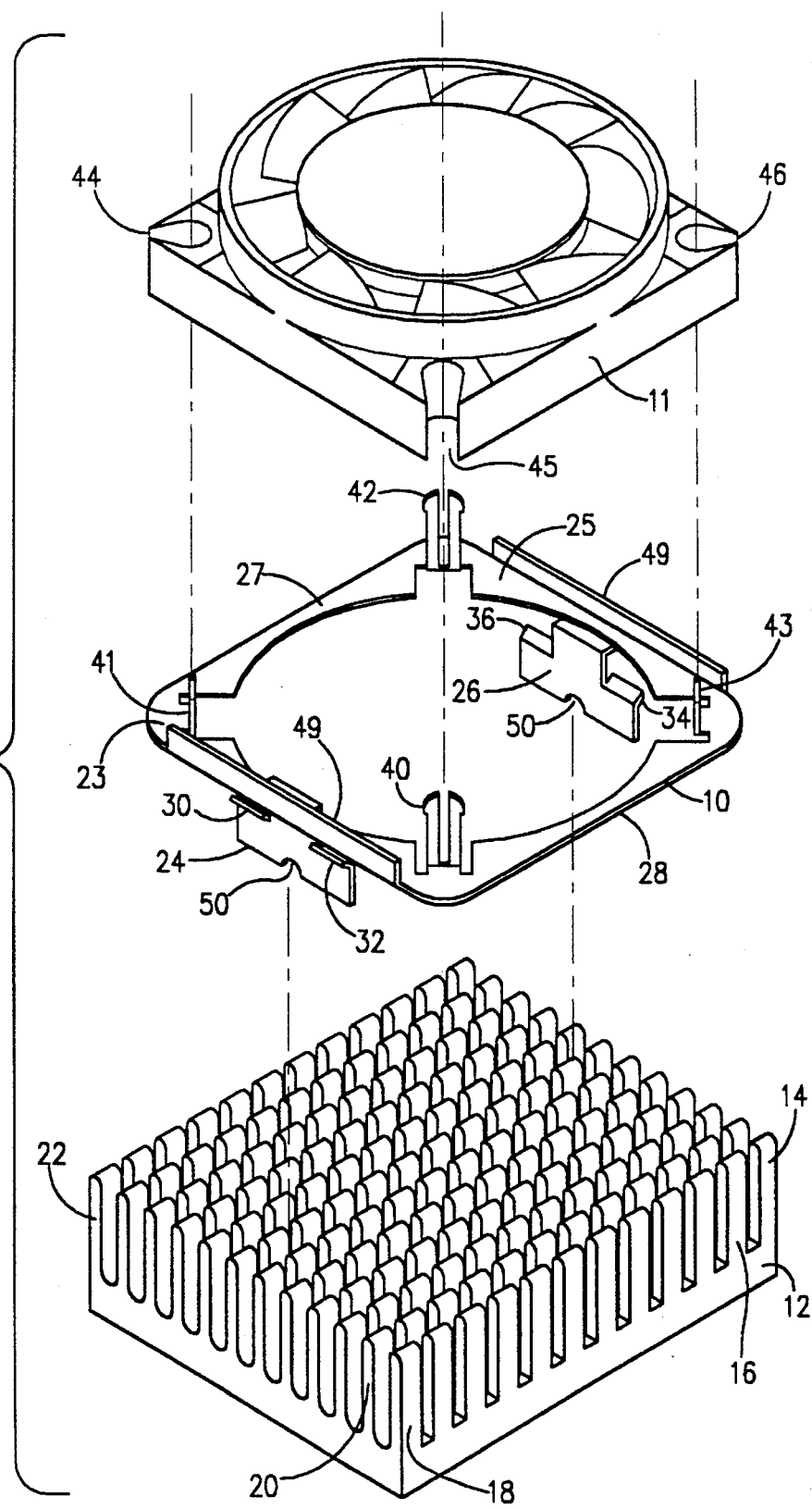
FIG. 1 is an exploded view of a fan, a heat sink and the clip of the present invention.
Figure 2:
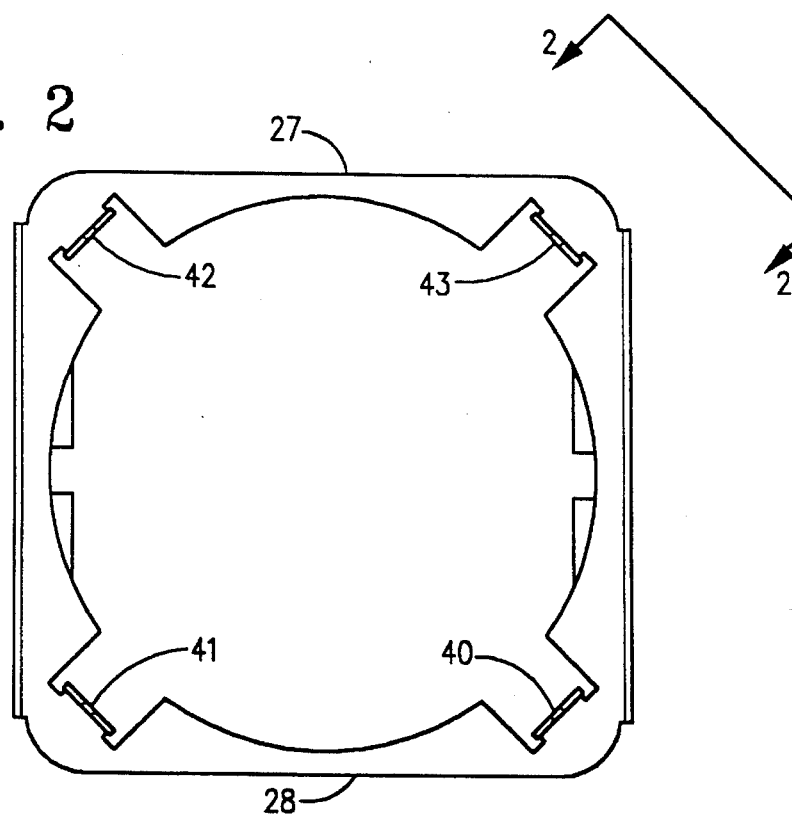
FIG. 2 is a top view of the clip.
Figure 3:
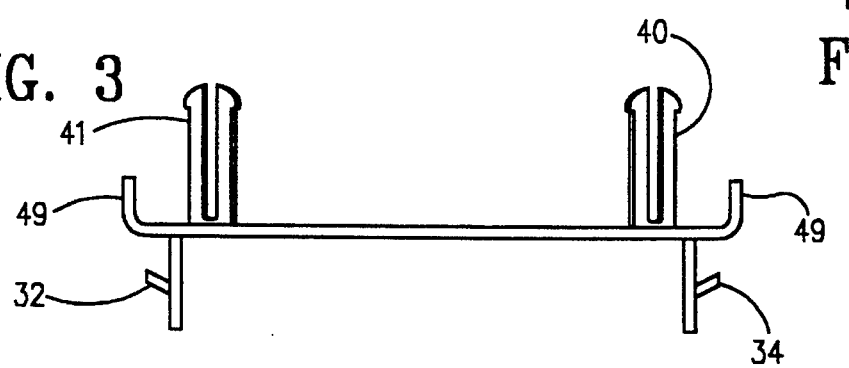
FIG. 3 is a front view of the clip.
Figure 4:
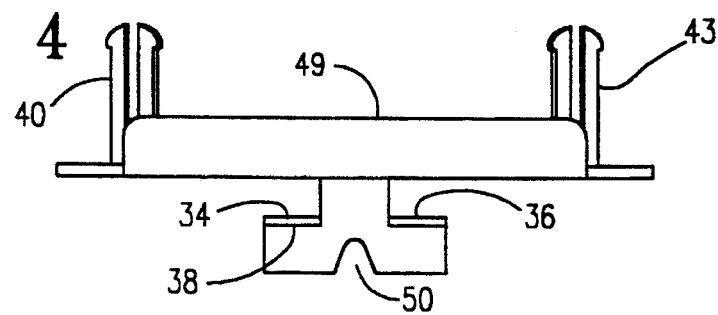
FIG. 4 is a side view of the clip.

FIGS. 2–4 show the clip 10 of the present invention 10 includes a frame having a width which can be wedged between the fins of the heat sink 12. Heat sink 12 is of the type made in accordance with the aforementioned '331 Hinshaw patent. It has pin fins 14, 16, . . . 18 in one row and similar fins in parallel rows. These rows of fins are extruded during the manufacturing process. Then, the rows of fins are cross-cut to form columns of pin fins. For example, pin fins 18, 20 . . . 22 are in a first column and there are successive parallel columns of pin fins.

The clip has a width which can be wedged between parallel columns of pin fins. Blades 24 and 26 extend downwardly from the frame. (Hereinafter the words "upwardly" and "downwardly" will be used to describe elements as viewed in the drawings, but it will be understood that these are relative terms which depend upon the direction from which those elements are viewed.) Blades 24 and 26 bear against the fins to secure the frame in the heat sink after it has been inserted therein. Sides 23 and 25 of the frame fit between adjacent columns of pin fins and sides 27 and 28 fit between adjacent rows of pin fins.

Tabs 30, 32, 34 and 36 lock the frame in the heat sink after it has been inserted. Tab 34 extends upwardly and outwardly from a bend line 38 (FIG. 4) along which the tab is bent out of the plane of the blade. The tab lockingly engages a fin against movement in the direction out of the heat sink. The tabs bite into the metal of the pin fins when upward pressure is exerted so that the frame is locked in the heat sink.

The clip is made of resilient metal such as stainless or plated steel. The clip is formed from a sheet of this resilient metal such that the width of the sheet forms the blades 24 and 26 which fit between the columns of the pin fins. Each of the blades spans one or more rows of the pin fins.

Figure 2A:
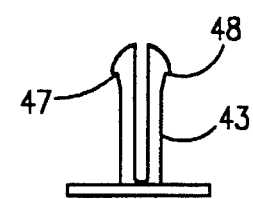
FIG. 2A is a view of the clip on the line 2—2.

Upstanding corner posts 40–43 engage the fan 11 to secure it to the frame 10. As best shown in FIG. 2A, each corner post is bifurcated so that it compresses as it is pushed into the slots 44 of the fan. The corner posts may also be pushed into mounting holes in the fan. Each corner post has barbs 47, 48. These barbs snap over the top lip of the slots 44–46 to lock the fan to the clip. Alternatively, when a fan has holes, instead of slots, the barbs dig into the hole to lock the fan to the clip.

Two edges 49 of the frame are turned upwardly to form a strengthening rib. This provides stability to the frame.

Figure 5:
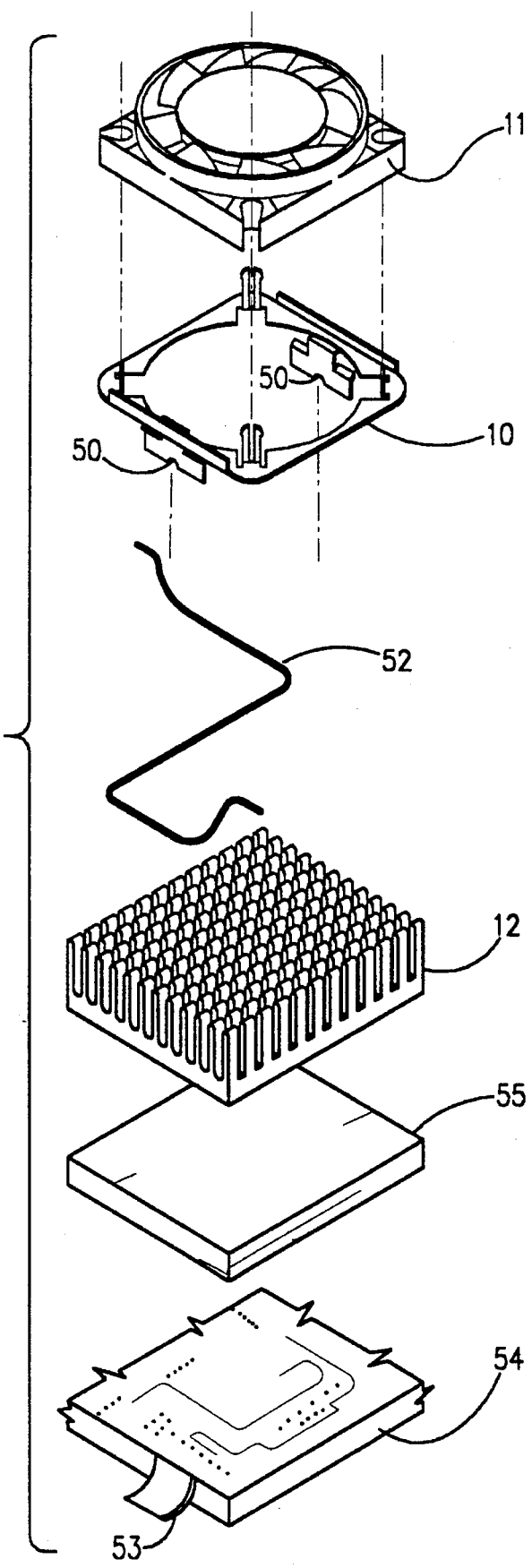
FIG. 5 is an exploded view of a fan, the clip of the present invention, a Z-spring retainer, a pin fin heat sink, an electronic device, and a socket.

Each of the blades has an arcuate cut-out 50. Arcuate cut-out 50 accommodates a wire clip 52 (FIG. 5) which secures the heat sink to a socket. Pages 15–29 of the Thermalloy catalog Thermalloy Semiconductor Accessories, show clips for attaching heat sinks to electronic devices. Z-clip 52 is trapped by the arcuate cut-outs 50 in the blades of the clip 10. The Z clip is engaged by the protrusion 53 on socket 54. In this manner, the assembly of socket 54, electronic device 55, heat sink 12, clip 10 and fan 11 are held together.

Other embodiments are within the true spirit and scope of the invention. The appended claims, are therefore, intended to cover all such embodiments.

What is claimed is:

1. A clip for securing a heat sink having upstanding parallel fins to a fan for cooling said heat sink comprising:
   a frame having a width adapted to be wedged between said fins of said heat sink;
   means adapted to secure said fan to said frame including upstanding corner posts on said frame adapted to engage said fan to secure it to said frame; and
   a blade extending downwardly from said frame adapted to bear against said fins to secure said frame to said heat sink, said blade having a downwardly facing arcuate cut-out which accommodates a wire clip adapted for securing said heat sink to a socket.

2. The clip recited in claim 1 wherein said frame includes two blades extending downwardly from opposite sides of said frame.

3. The clip recited in claim 1 further comprising:
   means adapted to lock said frame between the fins of said heat sink.

4. The clip recited in claim 3, wherein said means adapted to lock includes tabs extending from said blade, said tabs extending upwardly and outwardly from a bend line along which said tabs are bent out of the plane of said blade to lockingly engage said fins against movement in the upward direction.

5. The clip recited in claim 1 wherein said frame is resilient metal.

6. The clip recited in claim 5 wherein said frame is formed from a sheet of said resilient metal.

7. The clip recited in claim 6 wherein the width of said sheet forms said blades, said blades being adapted to fit between said columns of pin fins.

8. The clip recited in claim 1 wherein said blade is adapted to span at least two rows of pin fins.

9. The clip recited in claim 1 wherein said means for securing said fan to said frame includes upstanding corner posts adapted to engage said fan to secure it to said frame.

10. The clip recited in claim 9 wherein each corner post is bifurcated.

11. The clip recited in claim 10 wherein each corner post has a barb at the top thereof.

12. The clip recited in claim 1 wherein at least one edge of said frame is turned upwardly to form a strengthening rib to provide stability to said frame.

13. An assembly including:
   a pin fin heat sink having upstanding parallel fins;
   a fan for cooling said heat sink;
   a socket;
   an electronic device between said socket and said heat sink; and
   a clip for securing said heat sink to said fan comprising:
      a frame having a width which can be wedged between said fins of said heat sink;
      means on said frame for securing said fan to said frame; and
      a blade extending downwardly from said frame, said blade bearing against said fins to secure said frame to said heat sink, said blade having a downwardly facing arcuate cut-out which accommodates said wire clip to trap said wire clip in said heat sink.

14. A clip for securing a heat sink having upstanding parallel fins to a fan for cooling said heat sink comprising:
   a frame having a width adapted to be wedged between said fins of said heat sink;
   means adapted to secure to secure said fan to said frame including upstanding corner posts on said frame to engage said frame to secure it to said frame;
   a blade extending downwardly from said frame adapted to bear against said fins to secure said frame to said heat sink; and
   tabs extending from said blade adapted to lock said frame between the fins of said heat sink, said tabs extending upwardly and outwardly from a bend line along which said tabs are bent out of the plane of said blade to lockingly engage said fins against movement in the upward direction.

15. The clip recited in claim 14 wherein said blade has a downwardly facing arcuate cut-out which accommodates a wire clip for securing said heat sink to a socket.

* * * * *

UNITED STATES PATENT AND TRADEMARK OFFICE
CERTIFICATE OF CORRECTION

PATENT NO. : 5,590,025
DATED : December 31, 1996
INVENTOR(S) : Donald Clemens

It is certified that error appears in the above-indentified patent and that said Letters Patent is hereby corrected as shown below:

Col. 1, line 56, delete "Blades" and insert --The--.

Col. 2, line 41, after "invention" insert a period --.-- and insert the word --Clip-- to start the new sentence.

Signed and Sealed this

Tenth Day of June, 1997

Attest:

BRUCE LEHMAN

Attesting Officer

Commissioner of Patents and Trademarks